United States Patent [19]

Onetti et al.

[11] Patent Number: 5,726,604
[45] Date of Patent: Mar. 10, 1998

[54] DIFFERENTIAL TRANSCONDUCTOR STAGE DYNAMICALLY CONTROLLED BY THE INPUT SIGNAL'S AMPLITUDE

[75] Inventors: Andrea Mario Onetti, Pavia; Domenico Rossi, Cilavegna, both of Italy

[73] Assignee: SGS-Thomson Microelectronics, S.r.l., Agrate Brianza (Milan), Italy

[21] Appl. No.: 121,800

[22] Filed: Sep. 15, 1993

[30] Foreign Application Priority Data

Sep. 16, 1992 [EP] European Pat. Off. ............ 92830497.1

[51] Int. Cl.$^6$ ............................................. H03G 3/12
[52] U.S. Cl. .................... 330/283; 327/312; 327/530
[58] Field of Search ........................... 307/474, 542, 307/546, 296.1, 296.2, 360, 361, 362, 296.6; 330/254, 261, 257, 278, 259, 281, 283; 327/310, 317, 312, 530, 563, 561

[56] References Cited

U.S. PATENT DOCUMENTS 3,806,823  4/1974  Marek .................................. 330/69
4,378,370  3/1983  Harford ............................... 330/254
5,142,242  8/1992  Schaffer ............................... 330/257

FOREIGN PATENT DOCUMENTS

| 0173370 | 5/1986 | European Pat. Off. . | |
| 0491980 | 12/1990 | European Pat. Off. . | |
| 1246821 | 8/1967 | Germany | 330/261 |
| 2610276 | 3/1976 | Germany | 330/254 |
| 5573117 | 6/1980 | Japan | 330/254 |
| 0244910 | 10/1988 | Japan | 330/254 |
| 1517163 | 7/1978 | United Kingdom | 330/254 |

*Primary Examiner*—William L. Sikes
*Assistant Examiner*—Tiep H. Nguyen
*Attorney, Agent, or Firm*—Robert Groover; Betty Formby; Matthew S. Anderson

[57] ABSTRACT

The dynamic range of operation of a differential transconductance input stage is reduced when the amplitude of the input signal decreases, thus reducing the level of the noise that is generated by the input stage. A DC signal representative of the sensed amplitude of the input signal is employed for either reducing the value of a common, emitter-degenerating resistance or of the bias current that is forced in the two branches of the differential input stage.

28 Claims, 2 Drawing Sheets

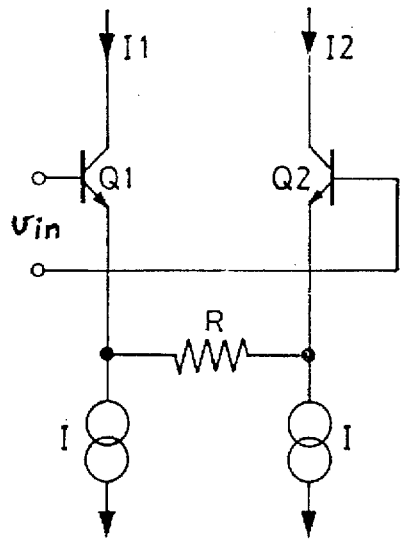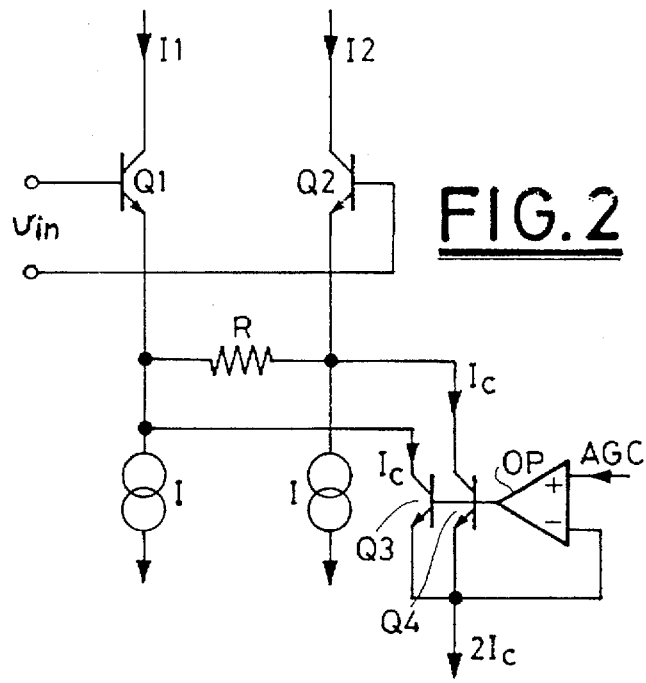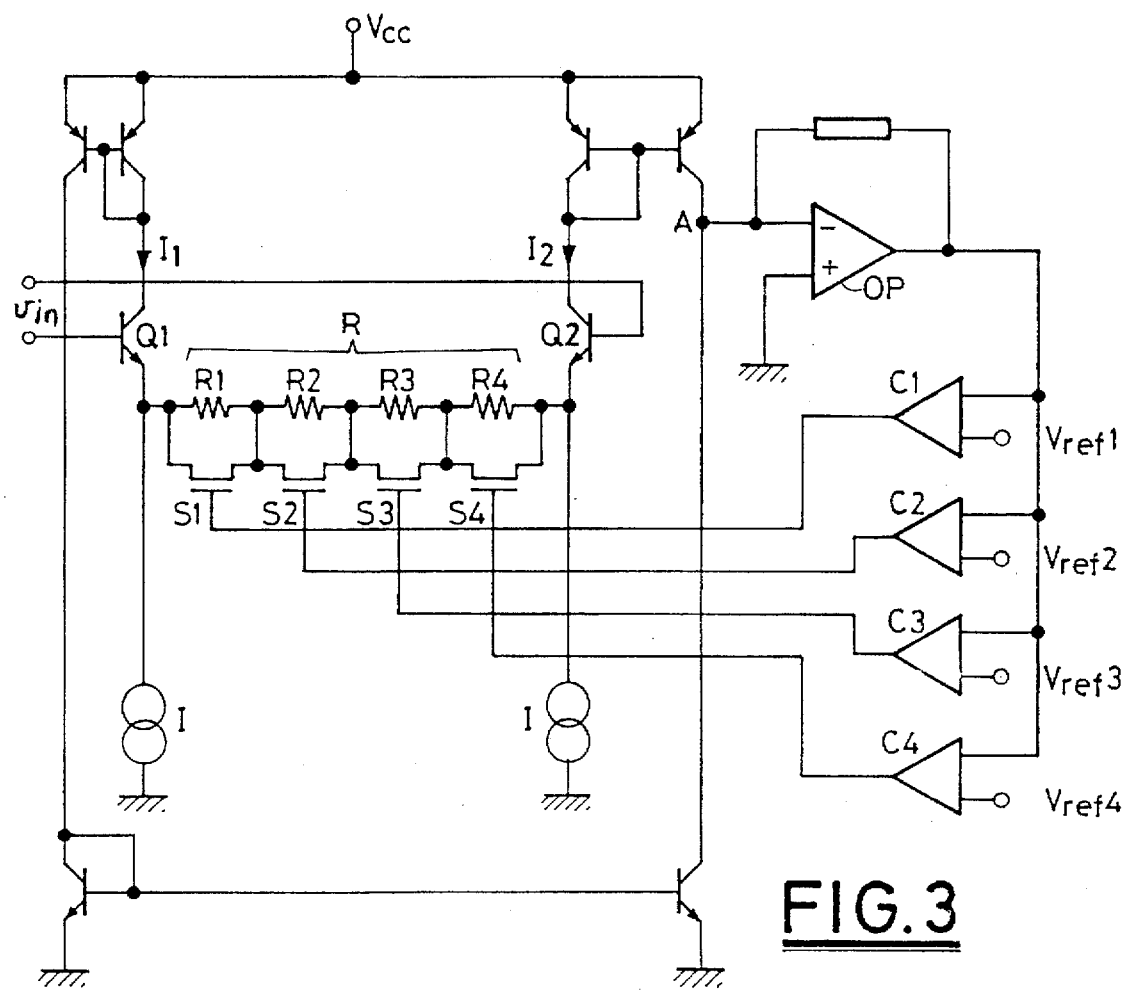

DIFFERENTIAL TRANSCONDUCTOR STAGE DYNAMICALLY CONTROLLED BY THE INPUT SIGNAL'S AMPLITUDE

CROSS-REFERENCE TO RELATED APPLICATION

This application claims priority from European App'n 92830497.1, filed Sep. 16, 1992, which is hereby incorporated by reference.

BACKGROUND AND SUMMARY OF THE INVENTION

The present invention relates to differential amplifiers and more particularly to a differential transconductance input stage.

Transconductors (voltage-current conversion devices) are now commonly used in many circuits such as variable-gain amplifiers and analog multipliers. They form the heart of these devices, their properties contributing significantly to the performance of these circuits and determining the distortion, gain, consumption and bandwidth.

A differential transconductance input stage, realized with a pair of bipolar junction transistors, is depicted in FIG. 1. The admittance of the stage may be defined as follows: $gm=1/R$, where R represents an emitter degenerating resistance, as shown in the figure.

The difference between the currents in the two branches of the differential circuit is given by:

$$\Delta I = (I1-I2) = g_m v_{in} = 1/R \, v_{in}$$

as long as the following condition is verified:

$$1/R \ll 1/re = kT/I$$

where k is Boltzmann's constant and T is the absolute temperature in degrees Kelvin.

The dynamic characteristics of such an input stage, i.e. the maximum amplitude of the input signal which may be handled by the differential stage without causing clipping effects on the output current, are proportional to the product between the emitter degeneration resistance R and the biasing current I that is forced through both branches of the differential circuit by respective current generators.

On the other hand, if one considers the noise which is produced by such a transconductance input stage, it may easily be observed that the generated noise is directly proportional to the value of the degeneration resistance R as well as to the level of the biasing current I. As a consequence, a high input dynamic characteristic is accompanied by a relatively high level of noise generated by the input stage.

This drawback of differential transconductance stages of the known type, if not eliminated completely, which is practically impossible, is greatly reduced in its effects by making the circuit according to the present invention, which permits to improve the noise figure of the stage.

Basically, the present invention relates to a circuit arrangement capable of modifying the dynamic characteristics of a transconductance input stage in dependence on the amplitude of the input signal, i.e. capable of reducing the dynamic range of operation when the amplitude of the input signal decreases.

According to a first embodiment of the invention, the parameter affecting the dynamic characteristics of the stage that is decreased as the amplitude of the input signal decreases is the biasing current that is forced through the two branches of the differential circuit by the dedicated current generators.

According to an alternative embodiment of the invention, the parameter affecting the dynamic characteristics of operation of the stage that is reduced when the amplitude of the input signal decreases is the value of the degenerating resistance.

Normally, the first embodiment is particularly suited for improving the noise characteristics of a transconductance input stage employed in a system wherein an automatic gain control loop already exists and therefore where a signal proportional to the amplitude of the input signal is already available, as for example in radio receivers. In this type of application, an operational amplifier driven, by the AGC signal, is employed for driving a pair of "by-pass" transistors capable of diverting a certain amount of the current that is forced by the biasing current generators through the two branches of the differential circuit and therefore reducing the effective biasing current which is actually forced through the two branches of the transconductance input differential stage.

According to an alternative embodiment of the invention, the degenerating resistance is made up of a plurality of resistances connected in series, each having a shunting switch for being selectively excluding from the series, as needed. Each shunting switch is driven by a respective comparator of a plurality of comparators having gradually decreasing threshold values and to which a signal representing the amplitude of the signal present at the input of the differential transconductance stage is fed. In this way, when the amplitude of the signal at the input of the stage decreases, one or more resistances are progressively excluded from the series in order to incrementally reduce the effective value of the degenerating resistance and therefore the dynamic characteristics of the stage.

In both cases, a reduction of the biasing current (I) and/or of the degenerating resistance (R) produces also a reduction of the noise that is generated by the input stage. In this way, the level of noise that is produced by the stage may be advantageously reduced whenever the amplitude of the input signal becomes smaller than a maximum design value. Overall, the input stage of the invention has a remarkably reduced noise figure.

According to the disclosed innovations there is also provided: an integrated circuit transconductor stage, comprising: a balanced pair of input transistors, each connected to receive a differential input signal at a respective control terminal thereof, and each comprising first and second current-carrying terminals; a degeneration resistor connected between the respective first current-carrying terminals of the pair of input transistors; a pair of current generators each connected, at the first current-carrying terminal of a respective one of the input transistors, to control a bias current therethrough; the second current-carrying terminals of the pair of input transistors being operatively connected to provide a current output corresponding to the differential input signal; and dynamic biasing circuitry, connected to alter the bias current through both the input transistors, in dependence on the average magnitude of the input signal, such that the bias current is reduced when the magnitude of the input signal is small.

According to the disclosed innovations there is also provided: an integrated circuit transconductor stage, comprising: a balanced pair of input transistors, each connected to receive a differential input signal at a respective control terminal thereof, and each comprising first and second current-carrying terminals; a controllable degeneration resistor connected between the respective first current-carrying terminals of the pair of input transistors; a pair of current generators each connected to the first current-carrying terminal of a respective one of the input transistors; the second current-carrying terminals of the pair of input transistors being operatively connected to provide a current output corresponding to the differential input signal; and control circuitry, connected to vary the value of the degeneration resistor, in dependence on the average magnitude of the input signal, such that the resistor has a smaller value when the magnitude of the input signal is small.

According to the disclosed innovations there is also provided: a method for operating a transconductance stage which includes a matched pair of input transistors, a degeneration resistor linking first current-carrying terminals of the pair of input transistors, and a pair of current generators each connected to control a bias current through one of the input transistors, comprising the steps of: sensing the averaged magnitude of the input signal; and dynamically varying the bias current through both of the input transistors, in dependence on the average magnitude of the input signal, such that the bias current is reduced when the magnitude of the input signal is small.

According to the disclosed innovations there is also provided: a method for operating a transconductance stage which includes a matched pair of input transistors, a degeneration resistor linking first current-carrying terminals of the pair of input transistors, and a pair of current generators each connected to control a bias current through one of the input transistors, comprising the steps of: sensing the averaged magnitude of the input signal; and dynamically varying the effective value of the resistor, in dependence on the average magnitude of the input signal, such that the resistor has a smaller value when the magnitude of the input signal is small.

BRIEF DESCRIPTION OF THE DRAWING

The present invention will be described with reference to the accompanying drawings, which show important sample embodiments of the invention and which are incorporated in the specification hereof by reference, wherein:

FIG. 1 is a basic circuit diagram of a differential transconductance stage;

FIG. 2 is a basic circuit diagram of a differential transconductance stage with controlled dynamic characteristics, according to a first embodiment of the invention.

FIG. 3 is a basic circuit diagram of a differential transconductance stage with controlled dynamic characteristics, according to an alternative embodiment of the invention.

DESCRIPTION OF THE PREFERRED EMBODIMENTS

Figure 4:
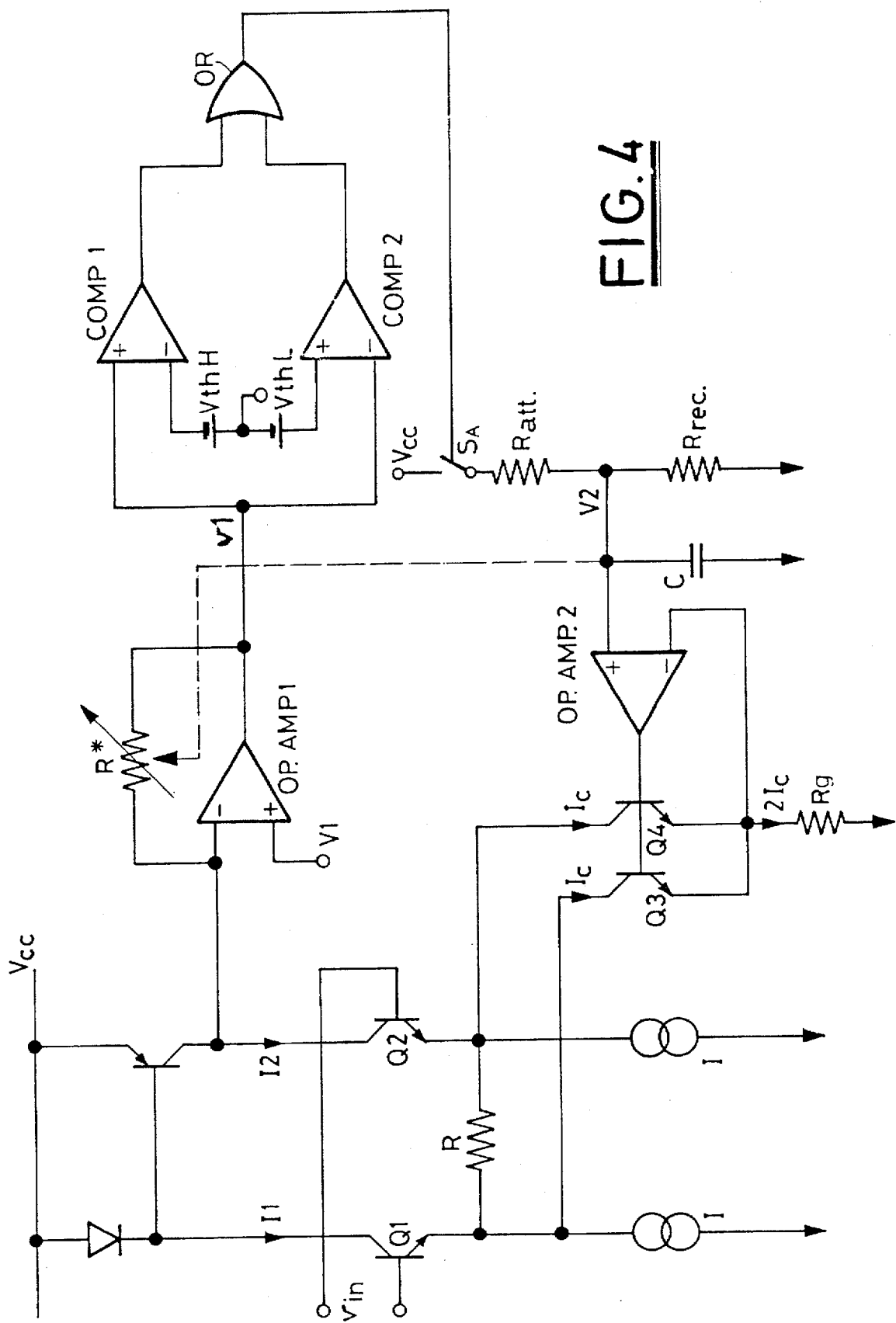
FIG. 4 is a functional diagram of an analog AC signal compressor stage employing a dynamically controlled transconductance stage of the present invention.

The numerous innovative teachings of the present application will be described with particular reference to the presently preferred embodiment. However, it should be understood that this class of embodiments provides only a few examples of the many advantageous uses of the innovative teachings herein. In general, statements made in the specification of the present application do not necessarily delimit any of the various claimed inventions. Moreover, some statements may apply to some inventive features but not to others.

A first embodiment of the invention is functionally depicted in FIG. 2. For simplicity's sake it is assumed that an AGC (Automatic Gain Control) signal be available, i.e. a signal proportional to the amplitude of the input signal $v_{in}$ which is applied to the input nodes of the differential transconductance stage. An AGC signal is normally present in analog amplifiers designed for amplifying signals of extremely variable amplitude, as for example in radio receivers.

According to this first embodiment, the circuit for controlling the dynamic characteristics of the differential transconductance stage comprises a pair of transistors Q3 and Q4, functionally connected between the generators I of the biasing current of the two branches of the differential circuit (Q1 and Q2), respectively, and a common ground node (or virtual ground node). The "by-pass" transistors Q3 and Q4 are driven by a driving buffer OP, to a first input of which an AGC signal is fed. In practice, the OP amplifier and the pair of transistors Q3 and Q4 constitute a voltage-to-current converter circuit. When the level of the AGC signal (i.e. the amplitude of the input signal $v_{in}$) decreases, the "conductivity" of the by-pass transistors Q3 and Q4 increases and so does the control current Ic that is subtracted from the current I generated by the respective current generators in each branch of the differential circuit. In this way, the actual biasing current and therefore the dynamic range of operation of the transconductance input stage is decreased, thus adapting it to the real amplitude of the input signal. By so reducing the level of the biasing current an attendant decrease of the level of the noise which is generated by the input stage is achieved as desired.

An alternative embodiment of the invention is schematically depicted in FIG. 3. According to this alternative embodiment, the parameter that is acted upon for reducing the level of the noise which is generated and the dynamic range of operation of the input stage is no longer the biasing current as in the prior embodiment, but the value of a common emitter degenerating resistance R. This is obtained by replacing a single degenerating resistance R with an equivalent series composed of a plurality of resistances (R1, R2, R3, and R4) connected in series. Each single resistance of the series is provided with a shunting switch (S1, S2, S3 and S4) driven by a respective threshold comparator (C1, C2, C3 and C4), belonging to a plurality of comparators, functionally having a different threshold which is made increasingly smaller. Each threshold may be established by applying a respective reference voltage (Vref1, Vref2, Vref3 and Vref4) to a first input of each comparator. To the other input of the comparators a signal having an amplitude proportional to the amplitude of the input signal $v_{in}$ is applied. In this case, when the amplitude of the input signal $v_{in}$ decreases, the triggering of a first and thereafter sequentially of the other comparators will occur, thus closing the relative shunting switches and reducing progressively the effective value of the degenerating resistance R of the transconductance stage. This will reduce the dynamic range of operation of the stage as well as also the level of the noise that is generated, as desired.

In the example shown in FIG. 3, the amplitude of the input signal $v_{in}$ is monitored as a DC voltage of variable level produced on the node A, by employing for this purpose a mirroring system for the currents I1 and I2 flowing in the two branches of the differential circuit, as shown in FIG. 3. Of course, other methods and means for producing a signal that is proportional to the amplitude of the input signal $v_{in}$ may be employed. An AGC signal may be used whenever available. An operational amplifier OP drives the various comparators having different thresholds (C1, C2, C3 and C4) in function of the signal present on the node A. The switches S1, S2, S3 and S4 may be made of as many field effect transistors, as shown.

The central circuit of the invention is particularly suited and simple to implement in systems provided with automatic gain control, such as for example analog compressors, where a DC signal proportional to the amplitude of the input signal is available.

A functional circuit diagram of an analog signal compression circuit for AC signals of varying amplitudes, incorporating a control circuit of the present invention, is depicted in FIG. 4. In this application, the circuit which performs a control on the level of the biasing current in the transconductance, input, differential stage (Q1–Q2) is represented in practice by a voltage-to-current converter, composed of the operational amplifier OPAMP 2 and by the pair of transistors Q3–Q4, similar to the circuit described in relation to FIG. 2. The resistance Rg is a current limiting resistance toward a common ground node of the circuit.

The function of analog compression of an AC input signal $v_{in}$ is performed by the operational amplifier OPAMP 1, the pair of comparators COMP1 and COMP2, the logic gate OR and the RC circuit, which comprises the capacitor C and the resistances $R_{att}$ and $R_{rec}$, respectively of charge (attack) and of discharge (recovery) of the capacitors C.

The switch $S_A$, driven by the output signal of the logic OR gate and the variable resistance R*, the value of which is regulated by the voltage V2, shown schematically in FIG. 4, complete the functional diagram of the compressor circuit.

Under conditions of low input signal amplitude, the value of the variable resistance R* is maximum, therefore the voltage gain of the stage is given by: $v1/v_{in} = R^*_{max}/R^*_{min}$. Moreover, by supposing that there are no other limitations in the management of the input dynamic characteristics, when the amplitude of v1 increases and becomes greater than the high threshold ($V_{thH}$), a high ("1") signal is produced at the output of the logic OR gate, which by closing the switch $S_A$, causes a rising of the voltage V2 across the RC group.

Commonly, the rise time constant of the voltage V2 (i.e. charge of C), regulated by the product $R_{att}C$ (also referred to as attack RC), is greater than the fall time constant of the voltage V2 (i.e. discharge of C), that is when the output of the OR gate is low ("0"), and which is given by the product $R_{rec}C$ (also referred to as recovery RC).

In any case, to a rising value of the voltage V2 corresponds a decreasing value of the resistance R* and therefore an overall attenuation of the signal v1 which is generated at the output of the operational amplifier OPAMP1. Therefore the system compresses relatively large signals by scaling them down to a maximum amplitude that is equal to the difference between the two threshold values: $V_{thH}$ and $V_{thL}$.

By assuming that the input signal has a peak value substantially lower than the product between the biasing current I and the emitter degenerating resistance R, under these conditions clipping of the signal will not occur because the reference voltage $V_{thH} > IR$. By increasing the amplitude of the input signal, when $IR > V_{thH}$, an increase of the voltage V2 occurs and consequently also the biasing current through the two branches of the transconductance input differential stage increases. This modifies (increases) the dynamic characteristics of operation of the input stage, thus adapting it to the increased level of the input signal. It may be said that when the input signal has a relatively low amplitude, the so-called "tail" current is low and therefore the noise which is generated by the input stage is reduced. When the amplitude of the input signal increases, the biasing current (tail current) as well as the noise generated increase. In conclusion, the operation characteristics of the input stage are optimized for what pertains to the noise characteristics thereof. Regardless of the fact that the circuit of the invention has been described as made with bipolar junction transistors, it is also possible to make the circuit with field effect transistors, for example in MOS technology. Also in this case the circuit arrangement of the invention will improve the noise characteristics of the input stage.

Further Modifications and Variations

It will be recognized by those skilled in the art that the innovative concepts disclosed in the present application can be applied in a wide variety of contexts. Moreover, the preferred implementation can be modified in a tremendous variety of ways. Accordingly, it should be understood that the modifications and variations suggested below and above are merely illustrative. These examples may help to show some of the scope of the inventive concepts, but these examples do not nearly exhaust the full scope of variations in the disclosed novel concepts.

For simplicity in exposition, the two classes of disclosed innovations have been described as modifications to the simple transconductor stage of FIG. 1; but it will be readily recognized by those of ordinary skill in the art that either of the two main disclosed ideas may be combined with any of the vast number of other transconductor stage configurations which have been proposed. For example, these innovative ideas may also be implemented in BICMOS or CBCMOS configurations instead of the complementary-bipolar implementation shown. For another example, cascode transistors and/or additional output current mirroring can be introduced if desired.

As will be recognized by those skilled in the art, the innovative concepts described in the present application can be modified and varied over a tremendous range of applications, and accordingly the scope of patented subject matter is not limited by any of the specific exemplary teachings given.

What is claimed is:

1. An integrated circuit transconductor stage, comprising:
   a balanced pair of input transistors, connected to receive a differential input signal at respective control terminals thereof, and each comprising first and second current-carrying terminals;
   a degeneration resistor connected between said respective first current-carrying terminals of said pair of input transistors;
   a pair of current generators each connected, at said first current-carrying terminal of a respective one of said input transistors, to control a bias current therethrough;
   said second current-carrying terminals of said pair of input transistors being operatively connected to provide a current output corresponding to the differential input signal and wherein said second current-carrying terminal of each of said input transistors is connected to provide current inputs to a respective pair of current mirror stages; and
   dynamic biasing circuitry, connected to alter said bias current through both said input transistors, in dependence on an average magnitude of the input signal, such that said bias current is reduced when the magnitude of the input signal is small.

2. The integrated circuit stage of claim 1, wherein said input transistors are bipolar.

3. The integrated circuit stage of claim 1, wherein said second current-carrying terminals of said input transistors are directly connected to respective output nodes, without intervening stages, to provide said current output.

4. The integrated circuit stage of claim 1, further comprising an averaging circuit connected to detect said average magnitude of the input signal and to provide a corresponding signal to said dynamic biasing circuitry.

5. The integrated circuit stage of claim 1, further comprising an averaging circuit connected to detect said average magnitude of the input signal, wherein said averaging circuit has a rise time constant greater than a fall time constant and to provide a corresponding signal to said dynamic biasing circuitry.

6. An integrated circuit transconductor stage, comprising:

a balanced pair of input transistors, connected to receive a differential input signal at respective control terminals thereof, and each comprising first and second current-carrying terminals;

a controllable degeneration resistor connected between said respective first current-carrying terminals of said pair of input transistors;

a pair of current generators each connected to said first current-carrying terminal of a respective one of said input transistors;

said second current-carrying terminals of said pair of input transistors being operatively connected to provide a current output corresponding to the differential input signal; and control circuitry, connected to vary the value of said degeneration resistor, in dependence on an average magnitude of the input signal, such that said resistor has a smaller value when the magnitude of the input signal is small.

7. The integrated circuit stage of claim 6, wherein said input transistors are bipolar.

8. The integrated circuit stage of claim 6, wherein said second current-carrying terminals of said input transistors are directly connected to respective output nodes, without intervening stages, to provide said current output.

9. The integrated circuit stage of claim 6, further comprising an averaging circuit connected to detect said average magnitude of the input signal and to provide a corresponding signal to said control circuitry.

10. The integrated circuit stage of claim 6, further comprising an averaging circuit connected to detect said average magnitude of the input signal, wherein said averaging circuit has a rise time constant greater than a fall time constant, and to provide a corresponding signal to said control circuitry.

11. An integrated circuit transconductor stage, comprising:

a balanced pair of input transistors, connected to receive a differential input signal at respective control terminal thereof, and each comprising first and second current-carrying terminals;

a controllable degeneration resistor connected between said respective first current-carrying terminals of said pair of input transistors;

a pair of current generators each connected to said first current-carrying terminal of a respective one of said input transistors;

said second current-carrying terminals of said pair of input transistors being operatively connected to provide a current output corresponding to the differential input signal; and control circuitry, connected to vary the value of said degeneration resistor, in dependence on an average magnitude of the input signal, such that said resistor has a smaller value when the magnitude of the input signal is small;

wherein said second current-carrying terminal of each of said input transistors is connected to provide current inputs to respective pairs of current mirror stages.

12. A differential transconductor stage comprising:

a pair of transistors functionally connected in series with a bias current generator between two supply nodes and having a common degenerating resistance connected between respective source or emitter terminals of said transistor pair, wherein each of said transistors are connected to provide current inputs to a respective pair of current mirror stages, connections for receiving an input signal across respective control terminals of said transistor pair, means for reducing a bias current by a quantity that is inversely proportional to the amplitude of said input signal.

13. The differential transconductor stage of claim 12, wherein said reducing means comprises a second pair of transistors, functionally connected between a first current generator of a first branch of said differential stage and a second current generator of a second branch of the differential stage, respectively, and a common ground node of the circuit, and an amplifier having at least an output which is connected to a control terminal of said second pair of transistors and an input to which a signal representative of the amplitude of said input signal is fed.

14. The transconductor stage of claim 12, wherein said transistors are bipolar.

15. The transconductor stage of claim 12, further comprising an averaging circuit connected to detect an average magnitude of the input signal and to provide a corresponding signal to said reducing means.

16. The transconductor stage of claim 12, further comprising an averaging circuit connected to detect an average magnitude of the input signal, wherein said averaging circuit has rise time constant greater than a fall time constant, and to provide a corresponding signal to said reducing means.

17. A differential transconductor stage comprising:

a pair of transistors functionally connected in series with a bias current generator between two supply nodes and having a common degenerating resistance connected between respective source or emitter terminals of said transistor pair, connections for receiving an input signal across respective control terminals of said two transistors, and means for reducing the value of said degenerating resistance by a quantity that is inversely proportional to the amplitude of said input signal.

18. A differential transconductor stage comprising:

a pair of transistors functionally connected in series with a bias current generator between two supply nodes and having a common degenerating resistance connected between respective source or emitter terminals of said transistor pair, connections for receiving an input signal across respective control terminals of said two transistors, and means for reducing the value of said degenerating resistance by a quantity that is inversely proportional to the amplitude of said input signal wherein said degenerating resistance is composed of a plurality of resistances connected in series and said means comprise a plurality of comparators each having a different predefined threshold voltage and incrementally decreasing from a first to a last comparator of said plurality of comparators, to inputs of which a signal representative of the amplitude of said input signal is fed, and a plurality of switches, each driven by a respective one of said plurality of comparators and functionally connected in parallel to a respective one of said plurality of resistances connected in series.

19. The transconductor stage of claim 17, wherein said transistors are bipolar.

20. The transconductor stage of claim 17, further comprising an averaging circuit connected to detect an average magnitude of the input signal and to provide a corresponding signal to said reducing means.

21. The transconductor stage of claim 17, further comprising an averaging circuit connected to detect an average magnitude of the input signal, wherein a rise time constant is greater than a fall time constant, and to provide a corresponding signal to said reducing means.

22. A differential transconductor stage comprising:

a pair of transistors functionally connected in series with a bias current generator between two supply nodes and having a common degenerating resistance connected between respective source or emitter terminals of said transistor pair, connections for receiving an input signal across respective control terminals of said two transistors, and means for reducing the value of said degenerating resistance by a quantity that is inversely proportional to the amplitude of said input signal;

wherein each of said transistors are connected to provide current inputs to respective pairs of current mirror stages.

23. A method for operating a transconductance stage which includes a matched pair of input transistors, a degeneration resistor linking first current-carrying terminals of the pair of input transistors, and a pair of current generators each connected to control a bias current through one of the input transistors, and wherein said second current-carrying terminal of each of said input transistors is connected to provide current inputs to a respective pair of current mirror stages, said method comprising the steps of:

(a.) sensing an averaged magnitude of an input signal; and (b.) dynamically varying the bias currents through both of the input transistors, in dependence on said average magnitude of the input signal, such that the bias current is reduced when said magnitude of input signal is small.

24. The method of claim 23, wherein said input transistors are bipolar.

25. The method of claim 23, wherein said sensing step (a) uses a rise time constant greater than a fall time constant.

26. A method for operating a transconductance stage which includes a matched pair of input transistors, a degeneration resistor linking first current-carrying terminals of the pair of input transistors, and a pair of current generators each connected to control a bias current through one of the input transistors, comprising the steps of:

(a.) sensing an averaged magnitude of the input signal; and (b.) dynamically varying the effective value of said resistor, in dependence on said average magnitude of the input signal, such that said resistor has a smaller value when the magnitude of the input signal is small.

27. The method of claim 26, wherein said input transistors are bipolar.

28. The method of claim 26, wherein said sensing step (a) uses unequal time constants for attack and decay wherein a rise time constant is greater than a fall time constant.

* * * * *

UNITED STATES PATENT AND TRADEMARK OFFICE
CERTIFICATE OF CORRECTION

PATENT NO. : 5,726,604
DATED : March 10, 1998
INVENTOR(S) : Andrea Mario Onetti, and Domencio Rossi It is certified that error appears in the above-identified patent and that said Letters Patent is hereby corrected as shown below:

Column 1, Line 30    Strike::

$$\text{``}\Delta I=(I1-I2)=g_m v_{in}=1/R\ v_{in}\text{''}$$

Insert::

$$--\Delta I=(I1-I2)=g_m v_{in}=1/R\ v_{in}--$$

Signed and Sealed this

Thirtieth Day of June, 1998

*Attest:*

BRUCE LEHMAN

*Attesting Officer*        *Commissioner of Patents and Trademarks*